(12) United States Patent
Adkisson et al.

(10) Patent No.: US 7,943,997 B2
(45) Date of Patent: May 17, 2011

(54) FULLY-DEPLETED LOW-BODY DOPING FIELD EFFECT TRANSISTOR (FET) WITH REVERSE SHORT CHANNEL EFFECTS (SCE) INDUCED BY SELF-ALIGNED EDGE BACK-GATE(S)

(75) Inventors: James W. Adkisson, Jericho, VT (US); Brent A. Anderson, Jericho, VT (US); Andres Bryant, Burlington, VT (US); William F. Clark, Jr., Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 206 days.

(21) Appl. No.: 12/104,683

(22) Filed: Apr. 17, 2008

(65) Prior Publication Data
US 2009/0261415 A1 Oct. 22, 2009

(51) Int. Cl.
*H01L 27/12* (2006.01)
(52) U.S. Cl. .......... 257/348; 257/E21.001; 257/E49.001
(58) Field of Classification Search ................... 257/348, 257/E21.001, E49.001
See application file for complete search history.

(56) References Cited

U.S. PATENT DOCUMENTS

| | | | |
|---|---|---|---|
| 4,952,527 A | 8/1990 | Calawa et al. |
| 5,001,076 A | 3/1991 | Mikkelson |
| 5,411,906 A | 5/1995 | Johnson et al. |
| 5,963,469 A | 10/1999 | Forbes |
| 5,991,225 A | 11/1999 | Forbes et al. |
| 6,097,065 A | 8/2000 | Forbes et al. |
| 6,104,068 A | 8/2000 | Forbes |
| 6,124,729 A | 9/2000 | Noble et al. |
| 6,188,111 B1 | 2/2001 | Kumagai |
| 6,191,448 B1 | 2/2001 | Forbes et al. |
| 6,229,342 B1 | 5/2001 | Noble et al. |
| 6,307,235 B1 | 10/2001 | Forbes et al. |
| 6,317,357 B1 | 11/2001 | Forbes |
| 6,320,222 B1 | 11/2001 | Forbes et al. |
| 6,340,612 B1 | 1/2002 | Noble et al. |
| 6,355,961 B1 | 3/2002 | Forbes |
| 6,368,938 B1 | 4/2002 | Usenko |
| 6,381,168 B2 | 4/2002 | Forbes |
| 6,399,979 B1 | 6/2002 | Noble et al. |
| 6,413,825 B1 | 7/2002 | Forbes |
| 6,418,050 B2 | 7/2002 | Forbes |
| 6,429,065 B2 | 8/2002 | Forbes |
| 6,434,041 B2 | 8/2002 | Forbes |
| 6,449,186 B2 | 9/2002 | Noble |

(Continued)

*Primary Examiner* — Laura M Menz
*Assistant Examiner* — Sonya D McCall Shepard
(74) *Attorney, Agent, or Firm* — Gibb IP Law Firm, LLC

(57) ABSTRACT

Disclosed are embodiments of a field effect transistor (FET) and, more particularly, a fully-depleted, thin-body (FDTB) FET that allows for scaling with minimal short channel effects, such as drain induced barrier lowering (DIBL) and saturation threshold voltage (Vtsat) roll-off, at shorter channel lengths. The FDTB FET embodiments are configured with either an edge back-gate or split back-gate that can be biased in order to selectively adjust the potential barrier between the source/drain regions and the channel region for minimizing off-state leakage current between the drain region and the source region and/or for varying threshold voltage. These unique back-gate structures avoid the need for halo doping to ensure linear threshold voltage (Vtlin) roll-up at smaller channel lengths and, thus, avoid across-chip threshold voltage variations due to random doping fluctuations. Also disclosed are method embodiments for forming such FETs.

18 Claims, 13 Drawing Sheets

U.S. PATENT DOCUMENTS

| | | |
|---|---|---|
| 6,477,080 B2 | 11/2002 | Noble |
| 6,483,156 B1 | 11/2002 | Adkisson et al. |
| 6,486,027 B1 | 11/2002 | Noble et al. |
| 6,486,703 B2 | 11/2002 | Noble et al. |
| 6,492,233 B2 | 12/2002 | Forbes et al. |
| 6,515,510 B2 | 2/2003 | Noble et al. |
| 6,597,037 B1 | 7/2003 | Forbes et al. |
| 6,611,023 B1 | 8/2003 | En et al. |
| 6,638,807 B2 | 10/2003 | Forbes et al. |
| 6,657,312 B2 | 12/2003 | Hirano |
| 6,680,224 B2 | 1/2004 | Shin et al. |
| 6,689,660 B1 | 2/2004 | Noble et al. |
| 6,734,510 B2 | 5/2004 | Forbes et al. |
| 6,764,901 B2 | 7/2004 | Noble et al. |
| 6,777,744 B2 | 8/2004 | Noble |
| 6,812,516 B2 | 11/2004 | Noble et al. |
| 6,818,937 B2 | 11/2004 | Noble et al. |
| 6,888,198 B1 | 5/2005 | Krivokapic |
| 6,897,517 B2 | 5/2005 | Van Houdt et al. |
| 6,964,903 B2 | 11/2005 | Forbes et al. |
| 6,982,460 B1 | 1/2006 | Cohen et al. |
| 6,996,150 B1 | 2/2006 | Shakuda |
| 7,015,547 B2 | 3/2006 | Hackler, Sr. et al. |
| 7,057,223 B2 | 6/2006 | Noble et al. |
| 7,148,537 B2 | 12/2006 | Matsuzawa |
| 2002/0102803 A1 | 8/2002 | Forbes et al. |
| 2003/0141525 A1 | 7/2003 | Nowak |
| 2006/0022264 A1 | 2/2006 | Mathew et al. |
| 2006/0172476 A1 | 8/2006 | Liao et al. |
| 2007/0052010 A1 | 3/2007 | Hsu et al. |
| 2009/0010056 A1* | 1/2009 | Kuo et al. .................... 365/184 |

* cited by examiner

FULLY-DEPLETED LOW-BODY DOPING FIELD EFFECT TRANSISTOR (FET) WITH REVERSE SHORT CHANNEL EFFECTS (SCE) INDUCED BY SELF-ALIGNED EDGE BACK-GATE(S)

BACKGROUND

1. Field of the Invention

The embodiments of the invention generally relate to fully-depleted, thin-body, field effect transistors and, more particularly, to a fully-depleted, thin-body, field effect transistor that exhibits relatively small drain-induced barrier lowering without requiring body doping or halos.

2. Description of the Related Art

As field effect transistor (FET) size continues to be scaled and, more particularly, as channel length is reduced, performance limitations referred to as "short-channel effects" arise. Such short-channel effects include, but art not limited to, drain-induced barrier lowering (DIBL) and saturation threshold voltage (Vtsat) roll-off. Specifically, DIBL refers to the fact that in a FET with a relatively short channel length the potential barrier that exists between the drain region and the source region is reduced by the electrostatic influence of the drain voltage. Vtsat roll-off refers to the fact that the relationship between channel length and the Vtsat is curved with significant Vtsat roll-off at smaller channel lengths. DIBL and Vtsat roll-off can both result in an increased off-state leakage current between the source and drain regions. Thus, there is a need in the art for a FET structure that allows for device scaling with minimal DIBL and Vtsat roll-off.

SUMMARY

In view of the foregoing, disclosed herein are embodiments of a field effect transistor (FET) and, more particularly, a fully-depleted, thin-body (FDTB) FET that allows for scaling with minimal short channel effects, such as drain induced barrier lowering (DIBL) and saturation threshold voltage (Vtsat) roll-off, at shorter channel lengths. The FDTB FET embodiment are configured with either an edge back-gate or split back-gate that can be biased in order to selectively adjust the potential barrier between the source/drain regions and the channel region for minimizing off-state leakage current between the drain region and the source region and/or for varying threshold voltage. These unique back-gate structures avoid the need for halo doping to ensure linear threshold voltage (Vtlin) roll-up at smaller channel lengths and, thus, avoid across-chip threshold voltage variations due to random doping fluctuations. Also disclosed are method embodiments for forming such FETs.

One embodiment of the FDTB FET of the present invention comprises a semiconductor layer comprising a source region, a drain region and a channel region between the source region and the drain region. This semiconductor layer can be thicker in the source and drain regions than in the channel region. A front gate can be positioned above the channel region. Since the source and drain regions are thicker than the channel region, this front gate is positioned laterally between the source and drain regions. To electrically isolate the front gate from the source and drain regions, dielectric spacers can be positioned on the semiconductor layer between the front gate and the source/drain regions.

Additionally, an edge back-gate can be positioned below the semiconductor layer at an interface between the channel region and the source region. Specifically, one sidewall of this edge back-gate can be positioned below the source region such that an end of the source region extends laterally beyond the first sidewall. Another sidewall can be positioned below the channel region relatively close to the source-channel region interface such that a center of the channel region extends laterally beyond the second sidewall.

A first insulator layer can be positioned adjacent to the edge back-gate on one side such that it is below the center of the channel region and further extends below the interface between the channel region and the drain region to below the drain region. A second insulator layer can be positioned adjacent the edge back-gate on the opposite side such that it is below the end of the source region. The width of the edge back-gate can be predetermined such that it is at least equal to the thickness of the semiconductor layer in the channel region. In operation, the edge back-gate can be electrically connected to a supply voltage and can be biased in order to selectively adjust a potential barrier between the source region and the channel region for minimizing off-state leakage current between the drain region the source region and/or for varying threshold voltage.

An alternative embodiment of the FDTB FET of the present invention can similarly comprise a semiconductor layer comprising a source region, a drain region and a channel region between the source region and the drain region. This semiconductor layer can be thicker in the source and drain regions than in the channel region. A front gate can be positioned above the channel region. Since the source and drain regions are thicker than the channel region, this front gate is positioned laterally between the source and drain regions. To electrically isolate the front gate from the source and drain regions, dielectric spacers can be positioned on the semiconductor layer between the front gate and the source/drain regions.

Additionally, this embodiment can comprise a split back-gate. This split back-gate can comprise discrete sections positioned below the interfaces between the channel region and the source/drain regions. That is, one section of the split back-gate can be positioned below the interface between the channel region and the source region and another section can be positioned below the interface between the channel region and the drain region. The width of each of the discrete sections can be predetermined such that it is at least equal to the thickness of the semiconductor layer in the channel region. The discrete sections can further have outer sidewalls below the source/drain regions such that the source/drain regions extend laterally beyond the outer sidewalls. Additionally, these discrete sections can be separated by a gap below the center of the channel region. This gap can have a predetermined width that is, for example, between approximately one third and one half the predetermined width of the front gate.

A first insulator layer can fill the gap between the two sections of the split back-gate and below the center of the channel region. A second insulator layer can be positioned adjacent the outer sidewalls of the split back-gate below the source/drain regions. As with the previously described embodiment, in operation, one or both of the discrete sections of the split back-gate can be electrically connected to a supply voltage and can be biased in order to selectively adjust a potential barrier between the source/drain regions and the channel region for minimizing off-state leakage current between the source/drain regions and/or for varying threshold voltage.

Also disclosed herein are embodiments of a method for forming the above-described FDTB FET with the edge back-gate. The method embodiments in this case comprise providing a wafer comprising a semiconductor layer having a first end region, a second end region and a center region between the first and second end regions.

An edge back-gate can be formed below the semiconductor layer at the interface between the center region and the first end region such that the edge back-gate has a one sidewall positioned below the first end region (i.e., such that an end of the first end region extends laterally beyond the first sidewall). This edge back-gate can further be formed such that it has another sidewall positioned below the center region relatively close to the interface between the first end region and the center region (i.e., such that a center of the center region extends laterally beyond the second sidewall).

To accomplish this, an etch process is performed that undercuts the semiconductor layer on one side of the wafer. Specifically, an etch process is performed that removes a first insulator layer from below the first end region of the semiconductor layer and further from below the interface between the first end region and the channel region. This etch process is performed such that a portion of the first insulator layer still remains below the center region and the second end region. Then, a gate conductor material is deposited such that it fills the space created below the semiconductor layer. The gate conductor material is then etched back such that it does not extend laterally beyond the end of the first end region. More specifically, the gate conductor material is etched back such that the resulting edge back-gate has a predetermined width that is at least equal to a predetermined thickness of the semiconductor layer in the center region. After the gate conductor material is etched back, a second insulator layer is deposited.

Once the edge back-gate is formed, the center region of the semiconductor layer can be recessed such that the semiconductor layer is thicker in the first and second end regions than in the center region. Once the center region is recessed, dielectric spacers can be formed on the resulting inner sidewalls of the first and second end regions. Then, a front gate can be formed on the center region. Specifically, this process of forming the front gate can comprise forming the front gate on the center region such that the front gate is positioned laterally between the first and second end regions and is electrically isolated from the first and second end regions by the dielectric spacers. Once the front gate is formed, an implant process can be performed in order to form a source region in the first end region, a drain region in the second end region and a channel region in the center region. Finally, additional conventional processing steps can be performed in order to complete this FDTB FET structure.

In operation, the edge back-gate of this FDTB FET can be electrically connected to a supply voltage (e.g., Vdd or ground) and can be biased in order to selectively adjust the potential barrier between the source region and the channel region for minimizing off-state leakage current between the drain region and the source region and/or for varying threshold voltage.

Also disclosed herein are embodiments of a method for forming the above-described FDTB FET with the split back-gate. The method embodiments in this case can similarly comprise providing a wafer comprising a semiconductor layer having end regions and a center region between the end regions.

A split back-gate can be formed with discrete sections below the interfaces between the center region and the end regions. Specifically, this split back-gate can be formed such that the discrete sections are separated by a gap below the center region and such that the end regions extend laterally beyond outer sidewalls of the split back-gate.

To accomplish this, an etch process is performed that undercuts the semiconductor layer on both sides of the wafer. Specifically, an etch process is performed that removes a first insulator layer from below the end regions of the semiconductor layer and, more particularly, below the interfaces between the center region and the end regions such that only a portion of the first insulator layer remains below the center region.

This etch process can be performed such that the portion of the first insulator layer that remains below the center region has a predetermined width that is between approximately one third and one half a predetermined width desired for a front gate. Next, a gate conductor material can be deposited such that it fills the spaces created below the semiconductor layer. The gate conductor material is then etched back such that it does not extend laterally beyond the ends of the end regions and such that the resulting discrete portions of the split back-gate each have a predetermined width that is at least equal to a predetermined thickness of the semiconductor layer in the center region. After the gate conductor material is etched back, a second insulator layer is deposited.

As with the previously described embodiment, once the split back-gate is formed, the center region of the semiconductor layer can be recessed such that the semiconductor layer is thicker in the end regions than in the center region. Once the center region is recessed, dielectric spacers can be formed on the resulting inner sidewalls of the end regions. Then, a front gate can be formed on the center region. Specifically, this process of forming the front gate can comprise forming the front gate on the center region of the semiconductor layer such that the front gate is positioned laterally between the end regions and is electrically isolated from the end regions by the dielectric spacers. Once the front gate is formed, an implant process can be performed in order to form source/drain regions in the end regions and a channel region in the center region.

In operation, the discrete portions of the split back-gate can be electrically connected to a supply voltage and can be biased in order to selectively adjust the potential barrier between the source/drain regions and the channel region for minimizing off-state leakage current between the drain region and the source region and/or for varying threshold voltage.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments without departing from the spirit thereof, and the embodiments include all such changes and modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
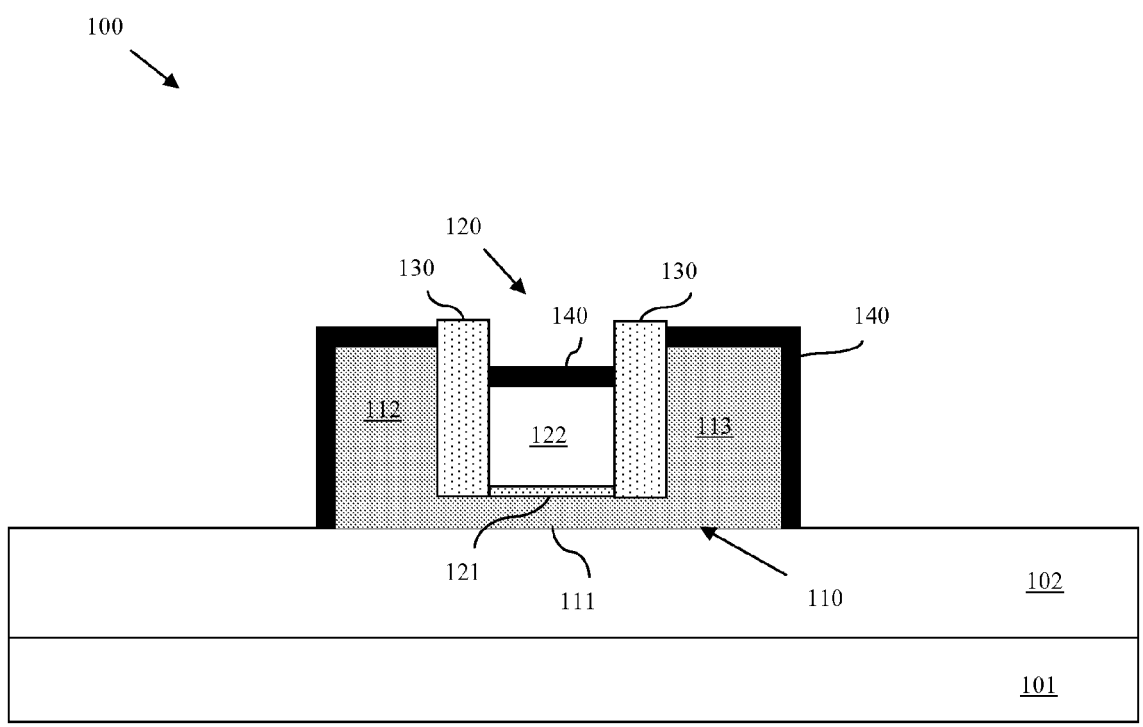
FIG. 1 is a cross-section diagram illustrating an exemplary prior art fully depleted thin body (FDTB) field effect transistor.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, as field effect transistor (FET) size continues to be scaled and, more particularly, as channel length is reduced, performance limitations referred to as "short-channel effects" arise. Such short-channel effects include, but art not limited to, drain-induced barrier lowering (DIBL) and saturation threshold voltage (Vtsat) roll-off. Specifically, DIBL refers to the fact that in a FET with a relatively short channel length the potential barrier that exists between the drain region and the source region is reduced by the electrostatic effects of the drain voltage. Vtsat roll-off refers to the fact that the relationship between channel length and the Vtsat is curved with significant Vtsat roll-off at smaller channel lengths. DIBL and Vtsat roll-off can both result in an increased off-state leakage current between the source and drain regions. Thus, there is a need in the art for a FET structure that allows for device scaling with minimal DIBL and Vtsat roll-off.

One conventional solution to DIBL and Vtsat roll-off is to change the dopant profile in the channel region (e.g., to a retrograde profile). Another conventional solution to DIBL and Vtsat roll-off is to implant dopants to form halos at the interfaces between the channel region and the source and drain regions. Unfortunately, random doping fluctuations with either channel or halo doping create across-chip threshold voltage (Vt) variations.

Referring to FIG. 1, a more recent solution to DIBL is the fully-depleted, thin-body (FDTB) FET 100. An exemplary FDTB FET structure 100 can comprise a substrate 101, an isolation layer 102 (e.g., a buried oxide layer) on the substrate 101, and a semiconductor layer 110 (e.g., a silicon layer, a silicon germanium layer, etc.) on the isolation layer 102. The semiconductor layer 110 can comprise a source region 112, a drain region 113 and a channel region 111 between the source region 112 and the drain region 113. A front gate 120, including a gate dielectric layer 121 (e.g., a silicon dioxide layer or other suitable gate dielectric layer) and a gate conductor layer 122 (e.g., a doped polysilicon material or other suitable gate conductor material) can be positioned above the channel region 111. However, in this case, the channel region 111 of the semiconductor layer 110 is thin relative to the source/drain regions 112-113 of the semiconductor layer 110 such that all or some of the front gate 120 is positioned laterally between the source/drain regions 112-113. For example, the channel region 111 can be less than approximately 10 mm, whereas the source/drain regions 112-113 can range between approximately 20 nm and approximately 50 m. Dielectric spacers 130 (e.g., nitride spacers) can electrically isolate the gate 120 from the source/drain regions 121-122. Silicide layers 140 can cover the top surface of the gate conductor 122 as well as the top and side surfaces of source/drain regions 112-113 of the semiconductor layer 110.

Figure 2:
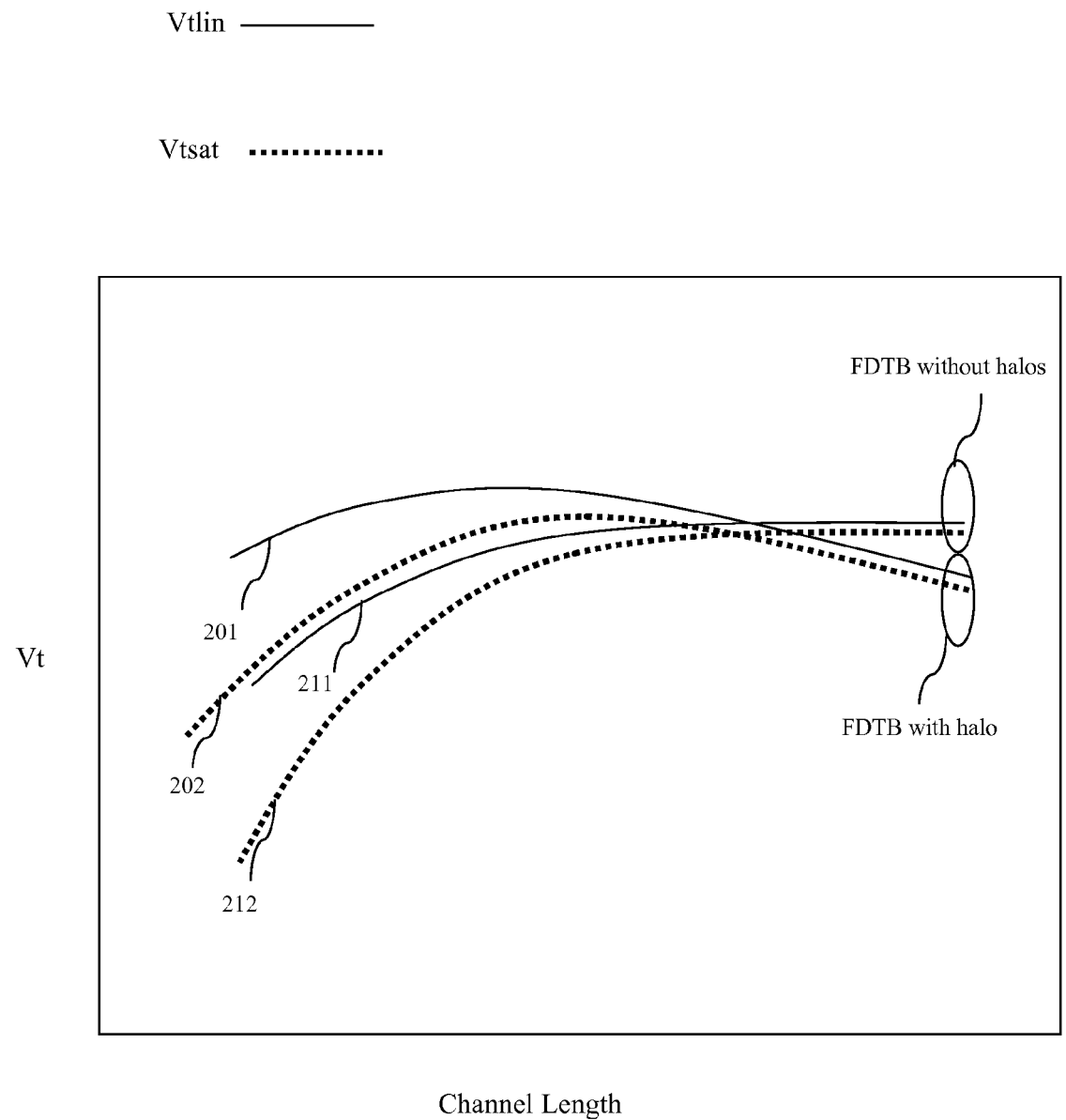
FIG. 2 is a graph illustrating linear and saturation threshold voltage curves for the FDTB FET of FIG. 1 configured with and without halos.

Due to the relatively thin channel region 111 compared to the relatively thick source/drain regions 112-113, these FDTB FETs 100 exhibit small DIBL at short channels without requiring channel or halo doping. Unfortunately, without such channel or halo doping, these FDTB FETs 100 do not exhibit linear threshold voltage (Vtlin) roll-up at smaller channel lengths, which in turn leads to high saturation threshold voltage (Vtsat) roll-off at smaller channel lengths, as illustrated in the graph of FIG. 2. Specifically, FIG. 2 illustrates the Vtlin 201 and Vtsat 202 for the exemplary FDTB FET 100 configured with halos and also illustrates Vtlin 211 and Vtsat 212 for the exemplary FDTB FET 100 configured without halos. As illustrated, with halos the Vtlin 201 rolls-up at smaller channel lengths and Vtsat 202 roll-off is minimized. However, without halos the Vtlin 211 exhibits roll-off with smaller channel lengths (i.e., a downward curve at smaller channel lengths) and Vtsat 212 exhibits an even more pronounced roll-off with smaller channel lengths (i.e., a sharp downward curve at smaller channel lengths). Thus, although DIBL is minimized without halos, which cause across-chip threshold voltage variation, off-state leakage current is still a factor due to Vtsat roll-off. This is true even for back-gated FDTB FETs, which can be biased to adjust for systematic variations, but can not adjust for random across-chip variations.

In view of the foregoing, disclosed herein are embodiments of a field effect transistor (FET) and, more particularly, a fully-depleted, thin-body (FDTB) FET that allows for scaling with minimal short channel effects, such as drain induced barrier lowering (DIBL) and saturation threshold voltage (Vt-sat) roll-off, at shorter channel lengths. The FDTB FET embodiment are configured with either an edge back-gate or split back-gate that can be biased in order to selectively adjust the potential barrier between the source/drain regions and the channel region for minimizing off-state leakage current between the drain region and the source region and/or for varying threshold voltage. These unique back-gate structures avoid the need for halo doping to ensure linear threshold voltage (Vtlin) roll-up at smaller channel lengths and, thus, avoid across-chip threshold voltage variations due to random doping fluctuations. Also disclosed are method embodiments for forming such FETs.

Figure 3:
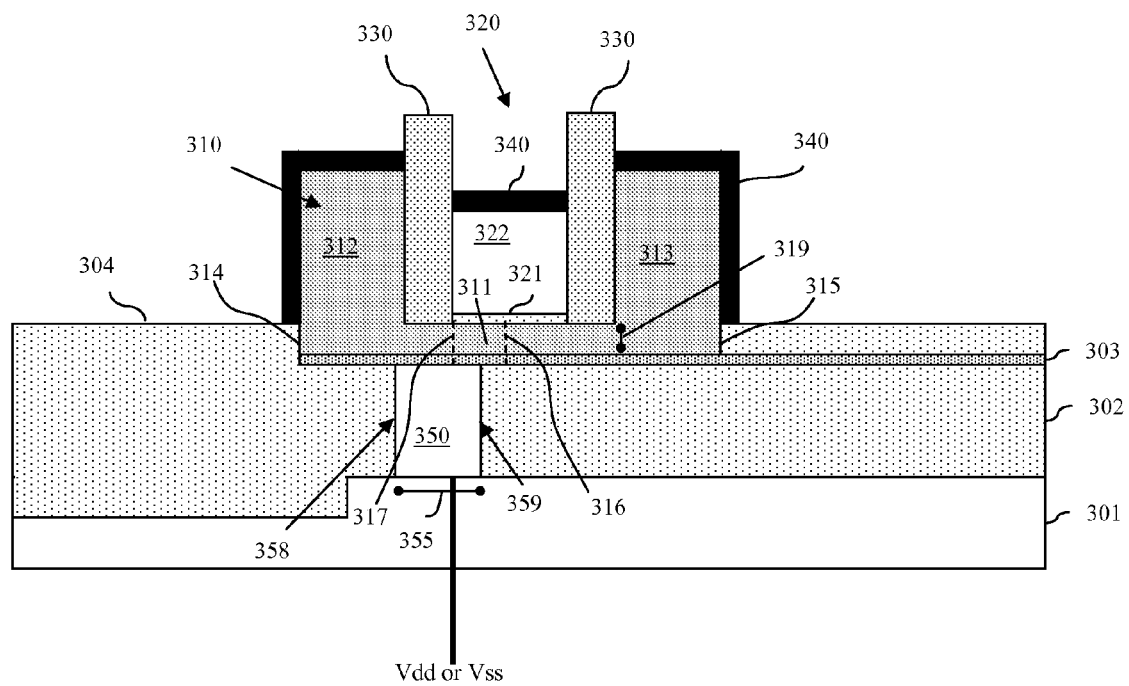
FIG. 3 is a cross-section diagram illustrating an embodiment of a FDTB FET 300 of the present invention.

Referring to FIG. 3, in one embodiment, a FDTB FET 300 of the present invention comprises a semiconductor layer 310 (e.g., a silicon layer, a silicon germanium layer, or other suitable semiconductor layer) comprising a source region 312, a drain region 313 and a channel region 311 between the source region 312 and the drain region 313.

The FET 300 can comprise an n-type FET with the source/drain regions 312-313 doped with an n-type dopant (e.g., phosphorus, arsenic or antimony). Alternatively, the FET 300 can comprise a p-type FET with the source/drain regions 312-313 doped with a p-type dopant (e.g., boron). Additionally, the semiconductor layer 310 can be thicker in the source and drain regions 312-313 than in the channel region 311. For example, the channel region 311 can be less than approximately 10 nm, whereas the source/drain regions 312-313 can range between approximately 20 nm and approximately 50 nm. The relatively thin channel region 311 minimizes drain induced barrier lowering (DIBL).

A front gate 320 (i.e., a top gate or second gate) can be positioned above the channel region 311. This front gate 320 can, for example, comprise a gate dielectric layer 321 directly adjacent the channel region 311 and a gate conductor layer 322 on the gate dielectric layer 321. The gate dielectric layer 321 can, for example, comprise an oxide material, an oxynitride material, a high-K dielectric material or some other suitable gate dielectric material. This gate dielectric layer 321 can, for example, range in thickness between approximately 0.5 nm and 2 nm. The gate conductor layer 322 can, for example, comprise an appropriately doped semiconductor material (e.g., doped polysilicon, doped polysilicon germanium, etc.); a metal or metal alloy material (e.g., tungsten, tantalum, aluminum, etc.); or other suitable gate conductor material. This gate conductor layer 322 can, for example, be less than approximately 50 nm thick and can have a predetermined width that defines the FET 300 channel length.

Since the source and drain regions 312-313 are thicker than the channel region 311, the front gate 320 is necessarily positioned laterally between the source and drain regions 312-313. To electrically isolate the front gate 320 from the source and drain regions 312-313, dielectric spacers 330 (e.g., nitride spacers) can be positioned on the semiconductor layer 310 between the front gate 320 and the source region 312 and between the front gate 320 and the drain region 313. Silicide layers 340 can cover the top surface of the gate conductor 322 as well as the top and all or part of the side 314-315 surfaces of source/drain regions 312-313 of the semiconductor layer 310.

Additionally, an edge back-gate 350 (i.e., an edge first gate) can be positioned below the semiconductor layer 310 at an interface 317 (i.e., at an edge) between the channel region 311 and the source region 312. Specifically, one sidewall 358 (i.e., a first sidewall) of this edge back-gate 350 can be positioned below the source region 312 such that the end 314 of the source region 312 extends laterally beyond the first sidewall 351. Another sidewall 359 (i.e., a second sidewall opposite the first sidewall) of this edge back-gate 350 can be positioned below the channel region 311 relatively close to the source-channel region interface 317 such that the center 316 of the channel region 311 extends laterally beyond the second sidewall 359. This edge back-gate 350 can comprise a gate conductor layer (e.g., an appropriately doped semiconductor material, such as a doped polysilicon, doped polysilicon germanium, etc.; a metal or metal alloy material, such as tungsten, tantalum, aluminum, etc.; or some other suitable gate conductor material). The edge back-gate 350 can also comprise a gate dielectric layer 303 (e.g., a 0.5-2 nm thick nitride layer) between the gate conductor layer and the semiconductor layer 310. Furthermore, the width 355 of the edge back-gate 350 can be predetermined such that it is at least equal to the thickness 319 of the semiconductor layer 310 in the channel region 311. For example, the predetermined width 355 of the edge back-gate can be at least equal to approximately 10 nm (e.g., can be approximately 15 nm).

A first insulator layer 302 (e.g., an oxide layer or other suitable insulator layer) can be positioned adjacent to the edge back-gate 350 on one side 359 such that it is between the wafer substrate 301 and the semiconductor layer 310. Specifically, this first insulator layer 302 can be positioned below the center 316 of the channel region 311 as well as below the interface between the channel region 311 and the drain region 313 and below the drain region 313. This first insulator layer 302 can be approximately 20-50 nm thick.

A second insulator layer 304 (e.g., another oxide layer or other suitable insulator layer) can be positioned adjacent to the edge back-gate 350 on the opposite side 358 such that it is below the end 314 of the source region 312. Due to the process steps (discussed in detail below) for forming the FET 300 structure, this second insulator layer 304 can be somewhat thicker than the first insulator layer 302.

In operation, the edge back-gate 350 can be electrically connected to a supply voltage (e.g., Vdd or Vss) and can be biased in order to selectively adjust a potential barrier between the source region 312 and the channel region 311 for minimizing off-state leakage current between the drain region 313 and the source region 312 and/or for varying threshold voltage.

Figure 4:
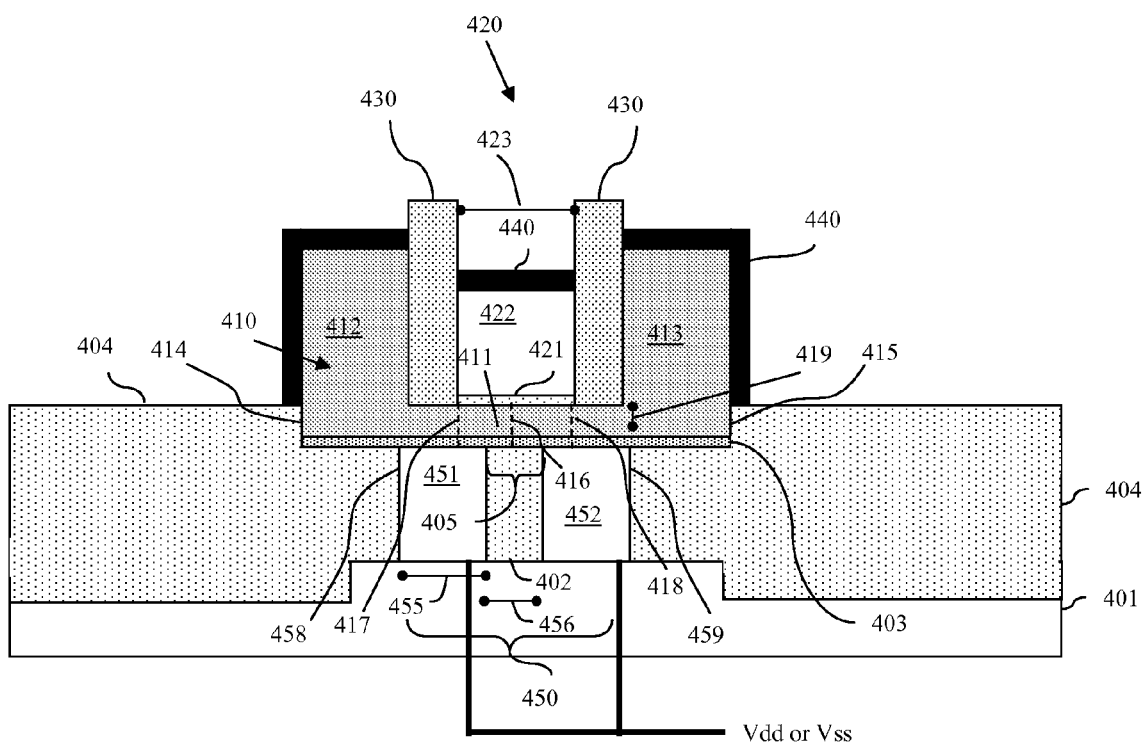
FIG. 4 is a cross-section diagram illustrating an alternative embodiment of a FDTB FET 400 of the present invention.

Referring to FIG. 4, in an alternative embodiment, a FDTB FET 400 of the present invention similarly comprises a semiconductor layer 410 (e.g., a silicon layer, a silicon germanium layer, or other suitable semiconductor layer) comprising a source region 412, a drain region 413 and a channel region 411 between the source region 412 and the drain region 413. This semiconductor layer 410 can be thicker in the source and drain regions 412-413 than in the channel region 411. For example, the channel region 411 can be less than approximately 10 nm, whereas the source/drain regions 412-413 can range between approximately 20 nm and approximately 50 nm. The relatively thin channel region 411 minimizes drain induced barrier lowering (DIBL).

A front gate 420 (i.e., a top gate or second gate) can be positioned above the channel region 411. This front gate 420 can, for example, comprise a gate dielectric layer 421 directly adjacent to the channel region 411 and a gate conductor layer 422 on the gate dielectric layer 421. The gate dielectric layer 421 can, for example, comprise an oxide material, an oxynitride material, a high-K dielectric material or some other suitable gate dielectric material. The gate dielectric layer 421 can, for example, range in thickness between approximately 0.5 nm and 2 nm. The gate conductor layer 422 can, for example, comprise an appropriately doped semiconductor material (e.g., doped polysilicon, doped polysilicon germanium, etc.); a metal or metal alloy material (e.g., tungsten, tantalum, aluminum, etc.); or some other suitable gate conductor material. This gate conductor layer 422 can be less than approximately 50 nm thick and can have a predetermined width that defines the FET 300 channel length.

Since the source and drain regions 412-413 are thicker than the channel region 411, the front gate 420 is necessarily positioned laterally between the source and drain regions 412-413. To electrically isolate the front gate 420 from the source and drain regions 412-413, dielectric spacers 430 (e.g., nitride spacers) can be positioned on the semiconductor layer 410 between the front gate 420 and the source region 412 and between the front gate 420 and the drain region 413. Silicide layers 440 can cover the top surface of the gate conductor 422 as well as the top and all or part of the side 414-415 surfaces of source/drain regions 412-413 of the semiconductor layer 410.

Additionally, this embodiment can comprise a split back-gate 450 (i.e., a split first gate). This split back-gate 450 can comprise discrete sections 451-452 positioned below the interfaces 417-418 between the channel region 411 and the source/drain regions 412-413. That is, one section 451 of the split back-gate 450 can be positioned below the interface 417 between the channel region 411 and the source region 412 and another section 452 can be positioned below the interface 418 between the channel region 411 and the drain region 413. The discrete sections 451-452 of the split back-gate 350 can each comprise a gate conductor layer (e.g., an appropriately doped semiconductor material, such as a doped polysilicon, doped polysilicon germanium, etc.; a metal or metal alloy material, such as tungsten, tantalum, aluminum, etc.; or some other suitable gate conductor material). The discrete sections 451-452 of the split back-gate 450 can also comprise a gate dielectric layer 403 (e.g., a 0.5-2 nm thick nitride layer) between the gate conductor layer and the semiconductor layer 410. These discrete sections 451-452 can further be separated from each other by an insulator-filled gap 405 below the center 416 of the channel region 411. This gap 405 can have a predetermined width 456 that is, for example, between approximately one third and one half the predetermined width 423 of the front gate 420. The discrete sections 451-452 can further have outer sidewalls 458-459 below the source/drain regions 412-413 such that the source/drain regions 412-413 extend laterally beyond the outer sidewalls 458-459. Furthermore, the width 455 of each of the discrete sections 451-452 can be predetermined such that it is at least equal to the thickness 419 of the semiconductor layer 410 in the channel region 411. For example, the predetermined width 455 of each of the discrete sections 451-452 of the split back-gate 450 can be at least equal to approximately 10 nm (e.g., can be approximately 15 nm).

A first insulator layer 402 can fill the gap 405. That is, the first insulator layer 402 can be positioned between the discrete sections 451-452 and further be positioned between the center 416 of the channel region 411 and the wafer substrate 401. This first insulator layer 402 can comprise, for example, an oxide layer or some other suitable insulator layer and can be approximately 20-50 nm thick.

A second insulator layer 304 (e.g., another oxide layer or some other suitable insulator layer) can be positioned adjacent the outer sidewalls 458-459 of the split back-gate 450 below the source/drain regions 412-413. Due to the process steps (discussed in detail below) for forming the FET 400 structure, this second insulator layer 404 can be somewhat thicker than the first insulator layer 402.

As with the previously described embodiment, in operation, one or both of the discrete sections 451-452 of the split back-gate 450 can be electrically connected to a supply voltage (e.g., Vdd or Vss) and can be biased in order to selectively adjust the potential barrier between the source/drain regions 412-413 and the channel region 411 for minimizing off-state leakage current between the source/drain regions 412-413 and/or for varying threshold voltage.

Also disclosed herein are embodiments of methods for forming the above-described FDTB FET 300 with the edge back-gate 350, as illustrated in FIG. 3, and for forming the above-described FDTB FET 400 with the split back-gate 450, as illustrated in FIG. 4.

Figure 5:
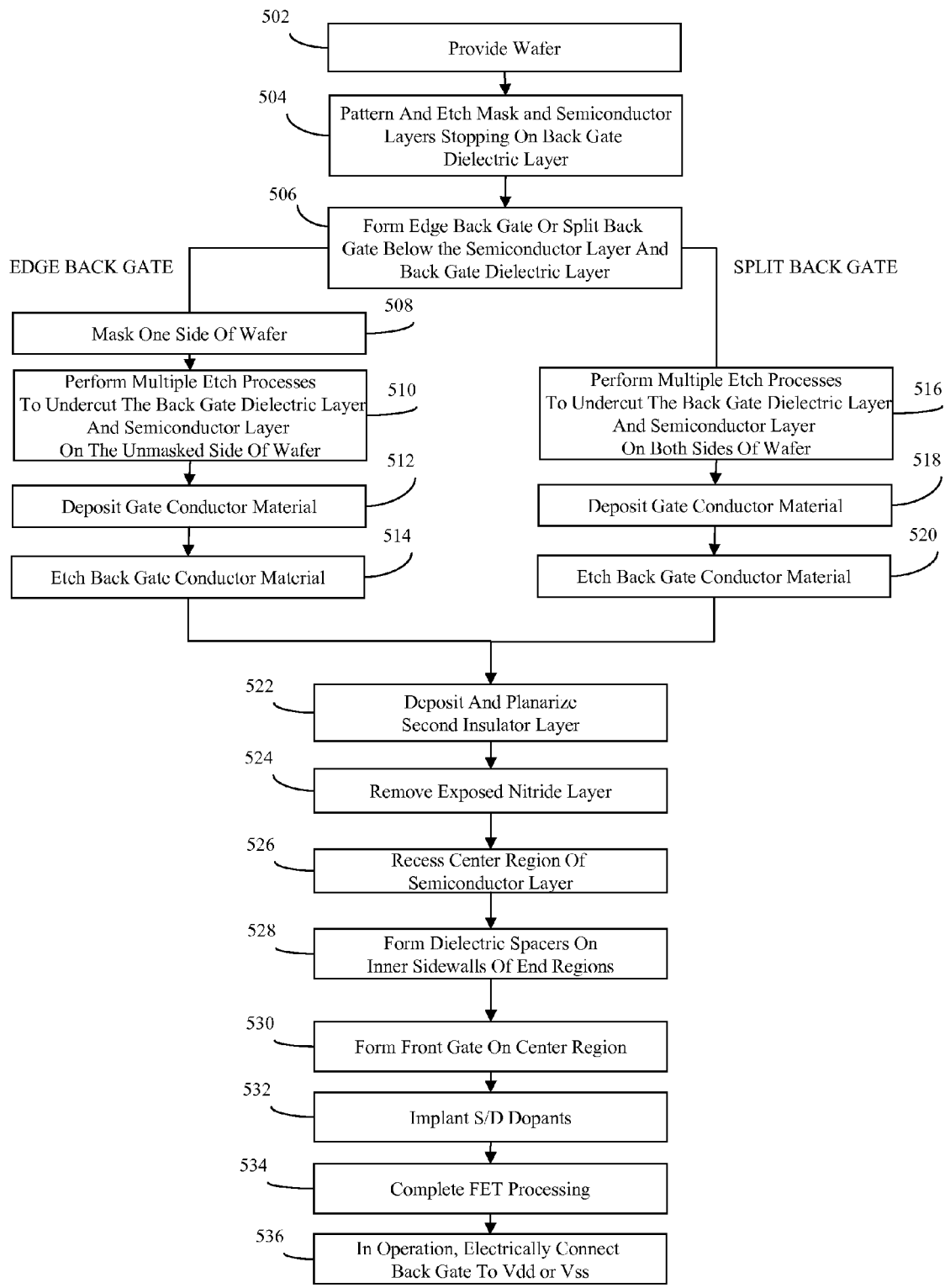
FIG. 5 is a flow diagram illustrating the embodiments of the method of the present invention.
Figure 6:
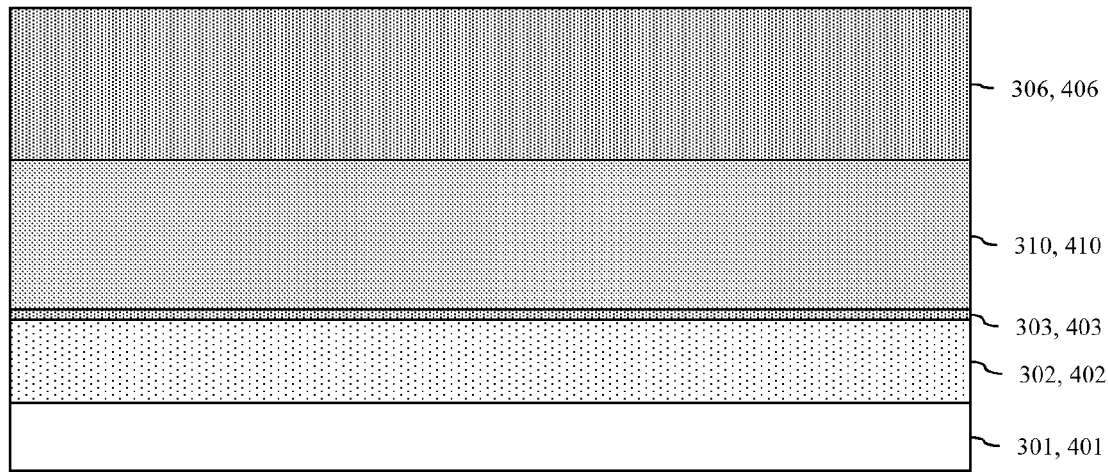
FIG. 6 is a cross-section diagram illustrating a partially completed FDTB FET 300 or 400.

Referring to the flow diagram of FIG. 5, the method embodiments all comprise providing a wafer comprising a semiconductor substrate 301, 401 (e.g., a p- or n-silicon substrate) and a plurality of additional layers formed (e.g., deposited, etc.) on top of the semiconductor substrate 301, 401 (502, see FIG. 6). Specifically, a first insulator layer 302, 304 can be formed on the semiconductor substrate 301, 401. This first insulator layer 302, 402 can comprise, for example, an oxide layer (e.g., a $SiO_2$ layer) or other suitable insulator layer and can be formed (e.g., deposited and planarized) such that it is approximately 20-50 nm thick. A dielectric layer 303, 403 (e.g., an approximately 0.5-2 nm nitride layer) for a back-gate (e.g., for either the edge back-gate 350 of FIG. 3 or the split back-gate 450 of FIG. 4) can be formed on the first insulator layer 302, 402. A semiconductor layer 310, 410 can be formed on the gate dielectric layer 303, 403. This semiconductor layer 310, 410 can, for example, comprise a silicon layer, a silicon germanium layer, or some other suitable semiconductor layer and can be formed (e.g., deposited and planarized) such that it is between approximately 20 nm and 50 nm thick. A mask layer 306, 406 (e.g., a less than 50 nm nitride layer) can be formed (e.g., deposited and planarized) on the semiconductor layer 310, 410.

Figure 7:
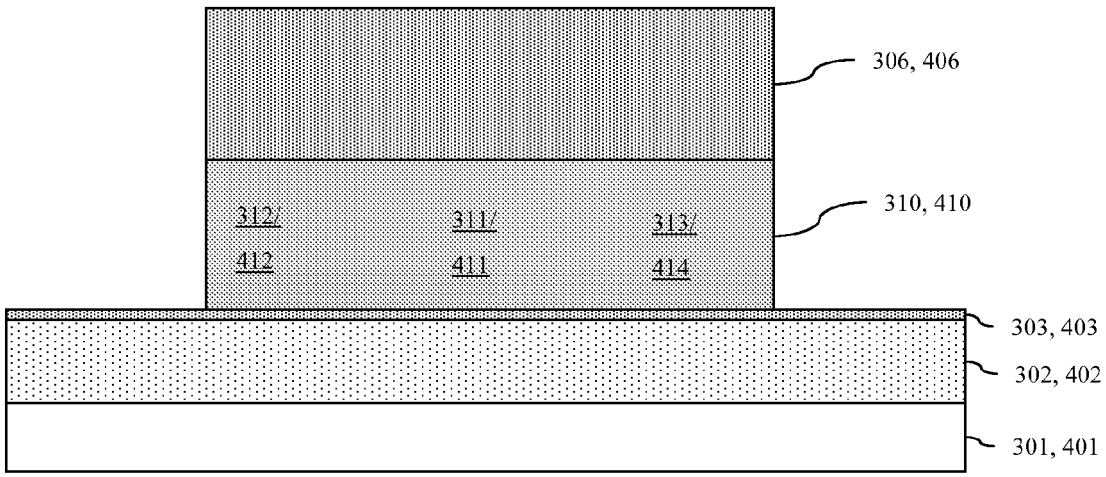
FIG. 7 is a cross-section diagram illustrating a partially completed FDTB FET 300 or 400.

Next, the mask layer 306, 406 and the semiconductor layer 310, 410 are lithographically patterned and etched, stopping on the back-gate dielectric layer 303, 403 (504, see FIG. 7) such that the remaining portion of the semiconductor layer 310, 410 is aligned below the remaining portion of the mask layer 306, 406. For processing purposes, this remaining portion of the semiconductor layer 310, 410 can be considered to comprise a first end region 312, 412 (which will subsequently be doped to form a source region), a second end region 313, 413 (which will subsequently be doped to form a drain region) and a center region 311, 411 between the first and second end regions 312-313, 412-413.

Next, either an edge back-gate 350 (i.e., an edge first gate), as illustrated in FIG. 3, or a split back-gate 450 (i.e., a split first gate), as illustrated in FIG. 4, can be formed below the semiconductor layer 310, 410 (506).

Specifically, in one embodiment an edge back-gate 350 (i.e., an edge first gate), as illustrated in FIG. 3, is formed at process 506. This edge back-gate 350 is formed below the interface 317 between the center region 311 and the first end region 312 such that the edge back-gate 350 has one sidewall 358 (i.e., a first sidewall) positioned below the first end region 312 (i.e., such that an end 314 of the first end region 312 extends laterally beyond the first sidewall 358). This edge back-gate 350 can further be formed such that it has another sidewall 359 (i.e., second sidewall opposite the first sidewall) positioned below the center region 311 relatively close to the interface 317 between the first end region 312 and the center region 311 (i.e., such that the center 316 of the center region 311 extends laterally beyond the second sidewall 359).

Figure 8:
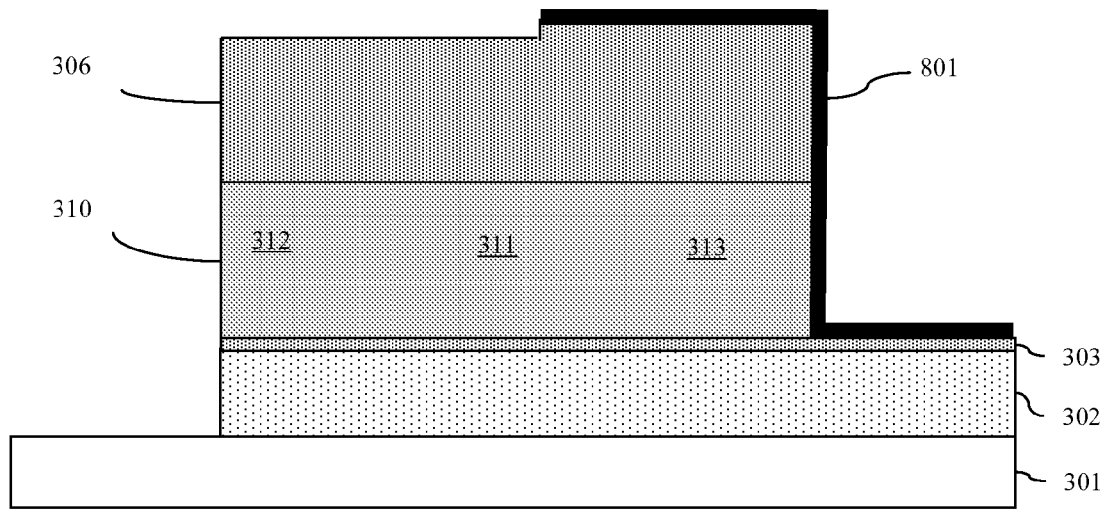
FIG. 8 is a cross-section diagram illustrating a partially completed FDTB FET 300.

To accomplish this, an additional mask layer 801 can be formed to cover the exposed surfaces on one side of the partially completed FET (508, see FIG. 8). This additional mask layer 801 can be formed, for example, by depositing, lithographically patterning and etching a polysilicon layer.

Figure 9:
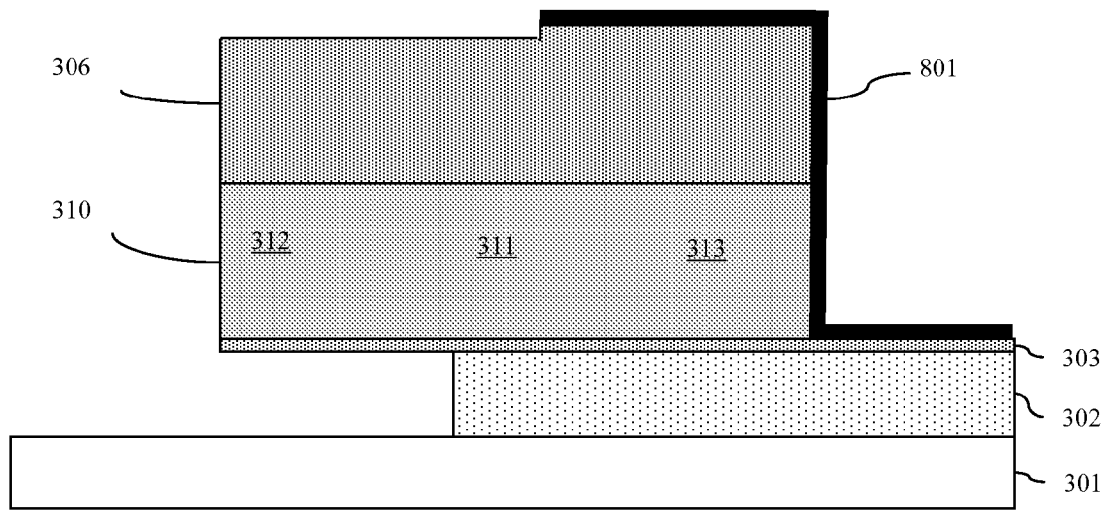
FIG. 9 is a cross-section diagram illustrating a partially completed FDTB FET 300.

Then, multiple etch processes are performed to undercut the back-gate dielectric layer 303 and the semiconductor layer 310 on the unmasked side of the wafer (510, see FIG. 9). Specifically, directional (i.e., anisotropic) etch processes are performed through the nitride layer 303 and first insulator layer 303 stopping on the substrate 301. Then, an isotropic etch process is performed that selectively removes the first insulator layer 303 from below the first end region 312 of the semiconductor layer 310 as well as from below the interface 317 between the first end region 312 and the channel region 311. For example, approximately 30 nm of the first insulator layer 302 can be removed from below one side of the semiconductor layer 310. This isotropic etch process should be performed selective to the first insulator layer 302 such that semiconductor layer 310 and the back-gate dielectric layer 303, which comprises a different material than the first insulator layer 302, remain essentially intact. After the isotropic etch process is performed on the first insulator layer 302, a portion of the first insulator layer 302 will remain below the center region 311 as well as below the second end region 313.

Figure 10:
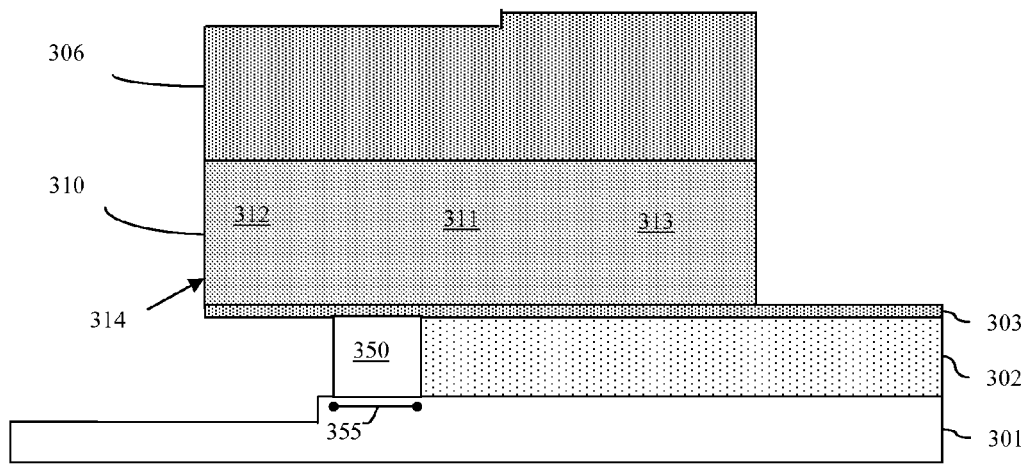
FIG. 10 is a cross-section diagram illustrating a partially completed FDTB FET 300.

Next, a gate conductor material (e.g., an appropriately doped semiconductor material, such as a doped polysilicon, doped polysilicon germanium, etc.; a metal or metal alloy material, such as tungsten, tantalum, aluminum, etc.; or some other suitable gate conductor material) is deposited such that it fills the space created below the back-gate dielectric layer 303 and semiconductor layer 310 (512). The gate conductor material is then etched back (i.e., isotropically etched) such that it does not extend laterally beyond the end 314 of the first end region 312, thus, forming the edge back-gate 350 (514, see FIG. 10). Specifically, the gate conductor material is etched back at process 514 such that the resulting edge back-gate 350 has a predetermined width 355 that is at least equal to a predetermined thickness of the semiconductor layer 310 in the center region 311, after FET processing. For example, the predetermined width 355 of the edge back-gate 350 can be at least 10 nm (e.g., approximately 15 nm). Additionally, it should be noted that this isotropic etch process should be preferential to undoped silicon and nitride to minimize and/or avoid simultaneous etching of the semiconductor layer 310 and nitride layers 303 and 306. It should also be noted that as a result of this isotropic etch process, the polysilicon mask layer 801 will be removed and some recessing of the wafer substrate 301 may occur.

Figure 11:
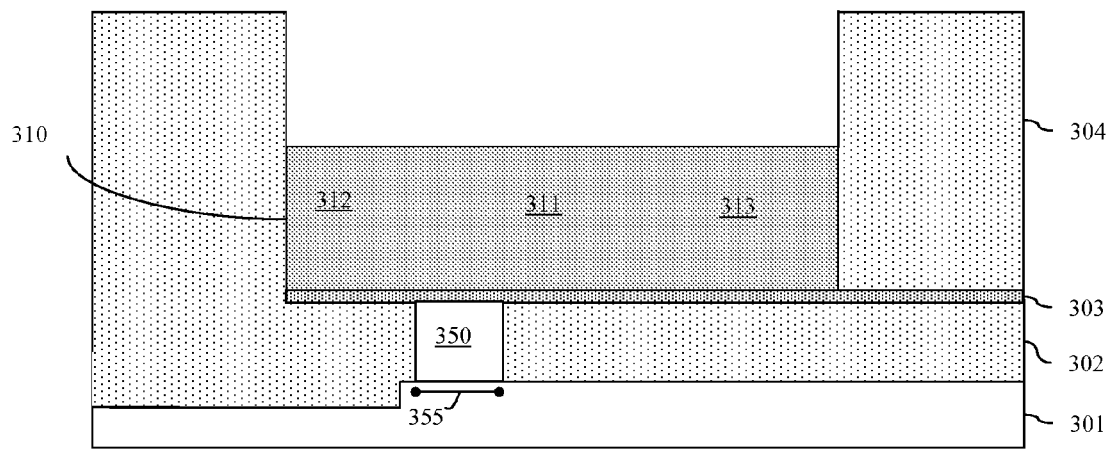
FIG. 11 is a cross-section diagram illustrating a partially completed FDTB FET 300.

In each of the method embodiments of the present invention, the following additional process steps 522-536 are performed. Specifically, after the gate conductor material is etched back at process 514, thereby forming the edge back-gate 350 of FIG. 3, a second insulator layer 304 is deposited and planarized to expose the nitride layer 306 (522). Then, the exposed nitride layer 306 is selectively removed to expose the semiconductor layer 310 and inner sidewalls of the second insulator layer 304 (524, see FIG. 11).

Figure 12:
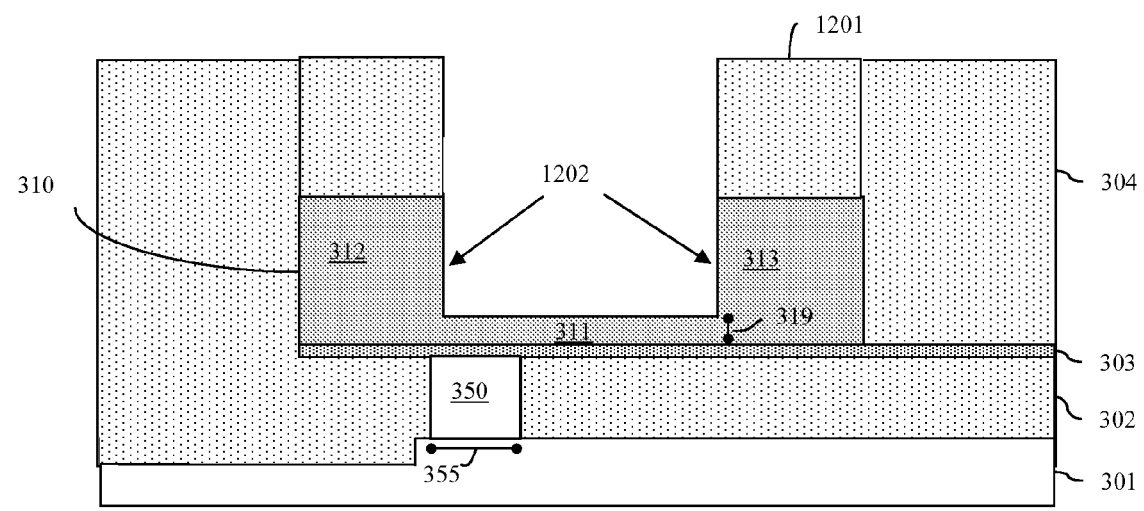
FIG. 12 is a cross-section diagram illustrating a partially completed FDTB FET 300.
Figure 13:
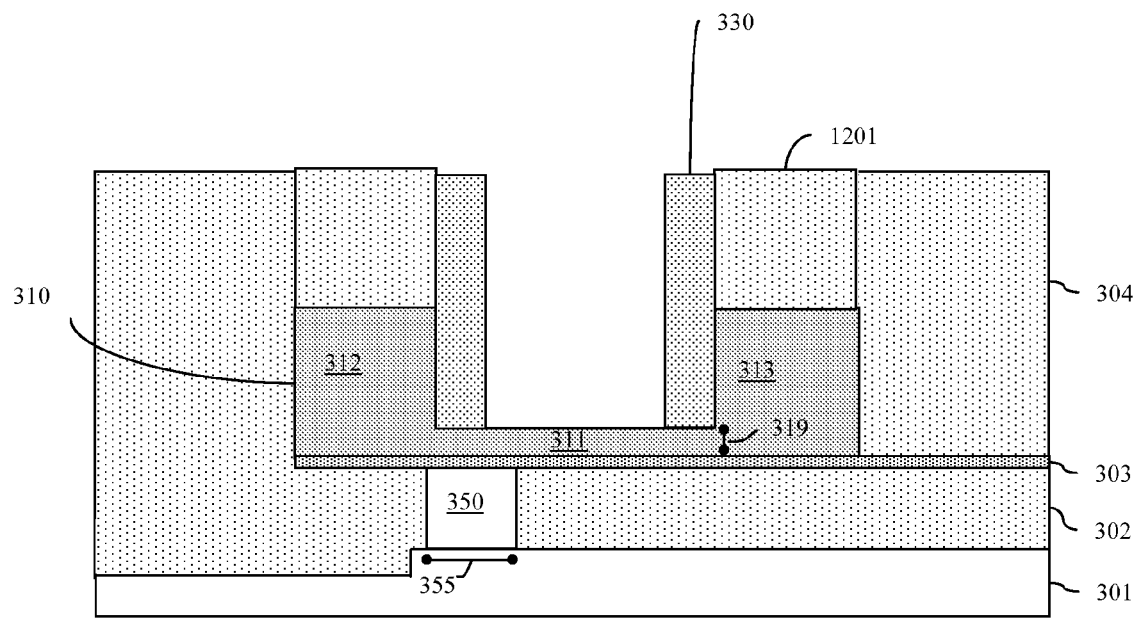
FIG. 13 is a cross-section diagram illustrating a partially completed FDTB FET 300.

Next, the center region 311 of the semiconductor layer 310 is recessed such that the semiconductor layer 310 is thicker in the first and second end regions 312-313 than in the center region 311 (526). To accomplish this, sacrificial sidewall spacers 1201 (e.g., approximately 25 nm thick oxide sidewall spacers) can be formed (e.g., using conventional sidewall spacer formation techniques) on the semiconductor layer 310 adjacent to the exposed inner sidewalls of the second insulator layer 304. Then, a directional etch process is performed to recess the exposed surfaces of the semiconductor layer 310 in the center region 311 to a predetermined thickness 319 (e.g., a predetermined thickness that is less than approximately 10 nm) (see FIG. 12). Thus, the directional etch process defines the thicker first and second end regions 312-313 and creates the inner sidewalls 1202. Once the center region 311 is recessed, dielectric sidewall spacers 330 (e.g., approximately 15 nm thick nitride sidewall spacers) can be formed (e.g., using conventional sidewall spacer formation techniques) on the inner sidewalls 1202 of the first and second end regions 321-313 (528, see FIG. 13).

Figure 14:
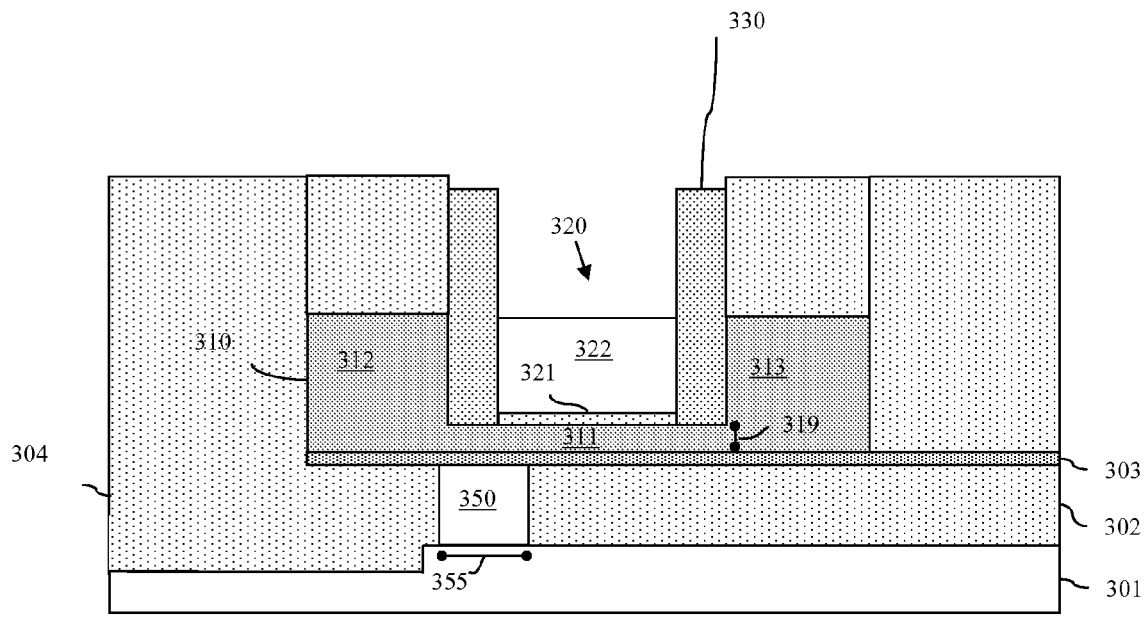
FIG. 14 is a cross-section diagram illustrating a partially completed FDTB FET 300.

Next, a front gate 320 (i.e., a top gate or second gate) can be formed on the center region 311 (530, see FIG. 14). Specifically, this process of forming the front gate 320 can comprise forming the front gate 320 on the center region 311 such that the front gate 320 is positioned laterally between the first and second end regions 312-313 and is electrically isolated from the first and second end regions 312-313 by the dielectric spacers 330. To form the front gate 320, a gate dielectric layer 321 is formed adjacent to the exposed center region 311. This gate dielectric layer 321 can be formed (e.g., using conventional processing techniques) such that it comprises an oxide material, an oxynitride material, a high-K dielectric material or some other suitable gate dielectric material. This gate dielectric layer 321 can further be formed such that it has a thickness that ranges between approximately 0.5 and 2 nm. Then, a gate conductor layer 322 is formed on the gate dielectric layer 322. This gate conductor layer 322 can be formed (e.g., using conventional processing techniques) such that it comprises a semiconductor material (e.g., polysilicon, polysilicon germanium, etc.); a metal or metal alloy material (e.g., tungsten, tantalum, aluminum, etc.); or other suitable gate conductor material. The gate conductor layer 322 can further be formed such that it is less than approximately 50 nm thick. It should be understood that the width of the gate 320 is predetermined in order to achieve a desired channel length (i.e., the width of the gate 320 defines the channel length) and this width is dependent upon the thicknesses of the spacers 1201 and 330.

Figure 15:
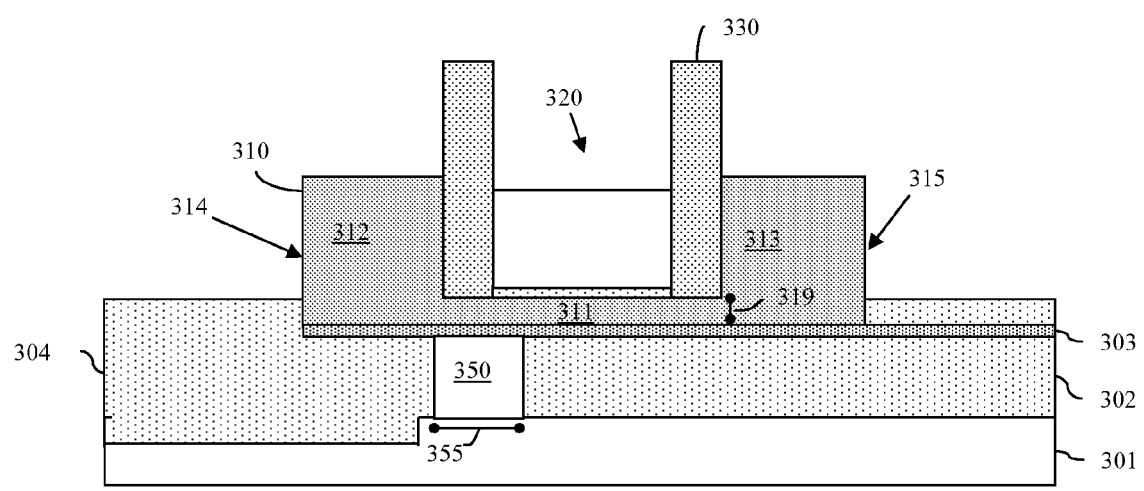
FIG. 15 is a cross-section diagram illustrating a partially completed FDTB FET 300.

Once the front gate 320 is formed, the exposed oxide materials 304 and 1201 can be recessed in order to completely remove the sacrificial spacers 1201 and to expose the top surface and all or part of the outer sidewalls (i.e., ends 314 and 315) of the end regions 312-313 (see FIG. 15). Next, an implant process can be performed in order to form a source region in the first end region 312, a drain region in the second end region 313 and a channel region in the center region 311 (532). For example, a p-type dopant (e.g., boron) can be implanted into the end regions 312-313 to form source/drain regions of a p-FET or n-type dopants (e.g., phosphorus, arsenic or antimony) can be implanted into the end regions 312-313 to form source/drain regions of an n-FET. This implant process can also be used to appropriately dope the gate conductor layer 322, as necessary.

Following implantation of the source/drain dopants, additional FET processing may be performed in order to complete the FET structure 300 (534, see FIG. 3). This additional FET processing can include, but is not limited to, silicide 340 formation, deposition and planarization of an additional insulator, contact formation, etc.

Finally, in operation, the edge back-gate 350 can be electrically connected to a supply voltage (e.g., Vdd or Vss) and can be biased in order to selectively adjust the potential barrier between the source region 312 and the channel region 311 for minimizing off-state leakage current between the drain region 313 and the source region 312 and/or for varying threshold voltage (536).

In an alternative embodiment, rather than forming the edge back-gate 350, a split back-gate 450 (i.e., a split first gate), as illustrated in FIG. 4, can be formed at process 506. This split back-gate 450 can be formed with discrete sections 451-452 below the interfaces 417-418 between the center region 411 and the end regions 412-413. Specifically, this split back-gate 450 can be formed such that the discrete sections 451-452 are separated by an insulator-filled gap 405 below the center region 411 and such that the end regions 412-413 extend laterally beyond outer sidewalls 458-459 of the split back-gate 450.

Figure 16:
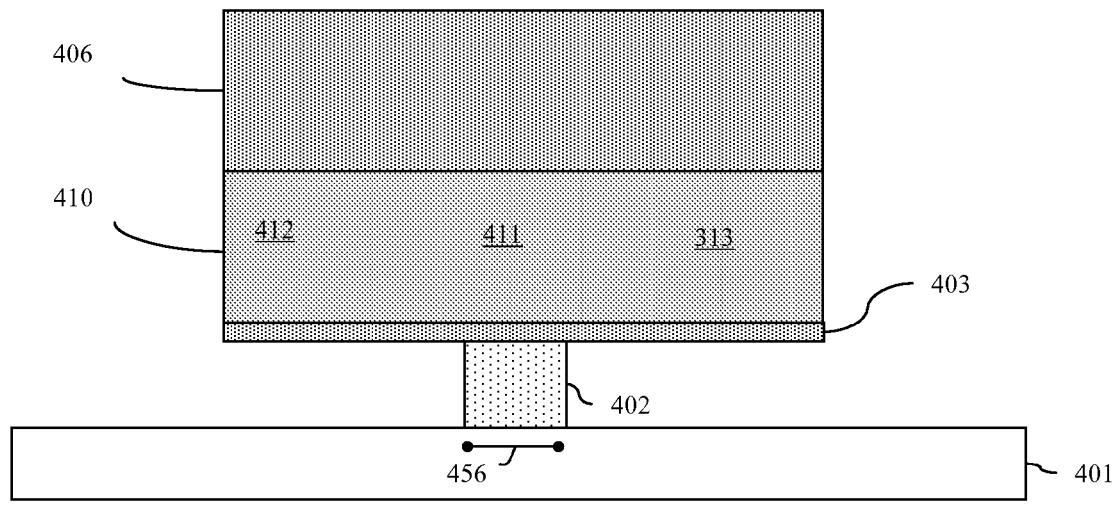
FIG. 16 is a cross-section diagram illustrating a partially completed FDTB FET 400.

To accomplish this, no additional mask layer is formed. Rather multiple etch processes are performed to undercut the back-gate dielectric layer 403 and the semiconductor layer 410 on both sides of the partially completed FET 400 (516, see FIG. 16). Specifically, directional (i.e., anisotropic) etch processes are performed through the nitride layer 403 and first insulator layer 403 stopping on the substrate 401. Then, an isotropic etch process is performed that removes the first insulator layer 403 from below the end regions 412-413 of the semiconductor layer 410 as well as from below the interfaces 417-418 between the end regions 412-413 and the channel region 411. For example, approximately 30 nm of the first insulator layer 402 can be removed from below both sides of the semiconductor layer 410. This isotropic etch process is performed on the first insulator layer 402 such that just a portion of the first insulator layer 402 remains on the substrate below the center region 411 and further such that this remaining portion of the first insulator layer 402 has a predetermined width 456 that is between approximately one third and one half the predetermined width of a subsequently formed front gate (i.e., a top gate or second gate that defines the channel length). Finally, the isotropic etch process should be selectively performed such that the semiconductor layer 410 and the back-gate dielectric layer 403, which comprises a different material than the first insulator layer 402, remain intact.

Figure 17:
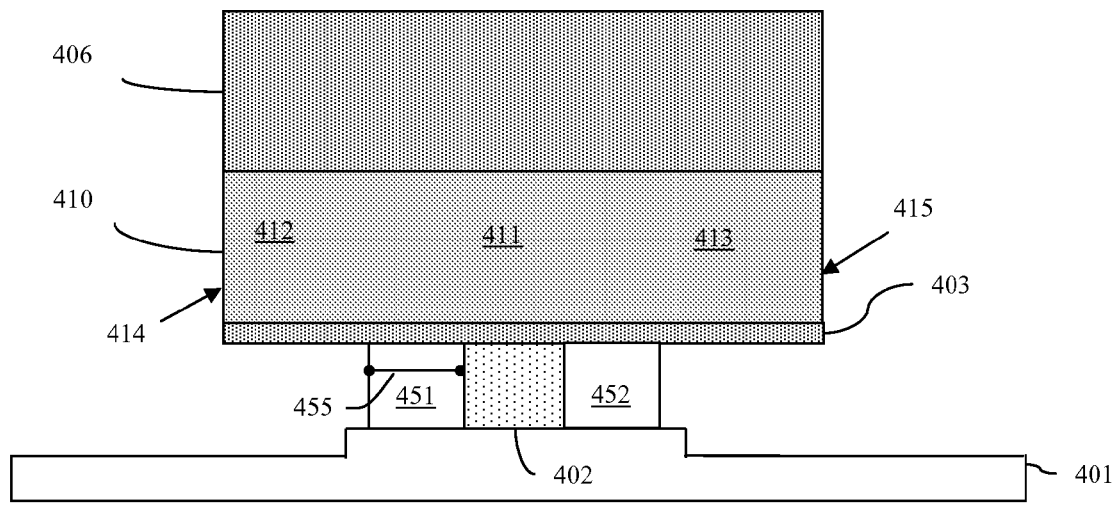
FIG. 17 is a cross-section diagram illustrating a partially completed FDTB FET 400.

Next, a gate conductor material (e.g., an appropriately doped semiconductor material, such as a doped polysilicon, doped polysilicon germanium, etc.; a metal or metal alloy material, such as tungsten, tantalum, aluminum, etc.; or some other suitable gate conductor material) can be deposited such that it fills the spaces created below the semiconductor layer 410 (518). The gate conductor material is then etched back (i.e., isotropically etched) such that it does not extend laterally beyond the ends 414-415 of the end regions 412-413, thereby forming the split back-gate 450 with discrete portions 451-452 (520, see FIG. 17). More specifically, the gate conductor material is etched back such that the resulting discrete portions 451-452 of the split back-gate 450 each have a predetermined width 455 that is at least equal to a predetermined thickness 419 of the semiconductor layer 410 in the center region 411, after FET processing. For example, the predetermined width 455 of each of the discrete sections 451-452 of the split back-gate 450 can be at least 10 nm (e.g., can be approximately 15 nm). Additionally, it should be noted that this isotropic etch process should be preferential to undoped silicon and nitride to minimize and/or avoid simultaneous etching of the semiconductor layer 410 and nitride layers 403 and 406. It should also be noted that as a result of this isotropic etch process, some recessing of the wafer substrate 401 may occur.

Figure 18:
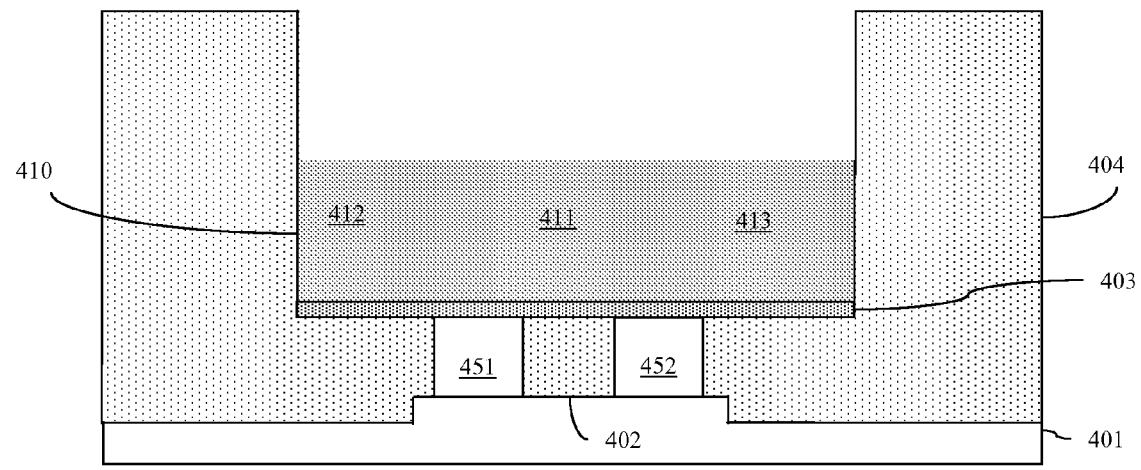
FIG. 18 is a cross-section diagram illustrating a partially completed FDTB FET 400.

As mentioned above, in each of the method embodiments of the present invention, the following additional process steps 522-536 are performed. Specifically, after the gate conductor material is etched back at process 520, thereby forming the split back-gate 450 of FIG. 4, a second insulator layer 404 is deposited and planarized to expose the nitride layer 406 (522). Then, the exposed nitride layer 406 is selectively removed to expose the semiconductor layer 410 and inner sidewalls of the second insulator layer 404 (524, see FIG. 18).

Figure 19:
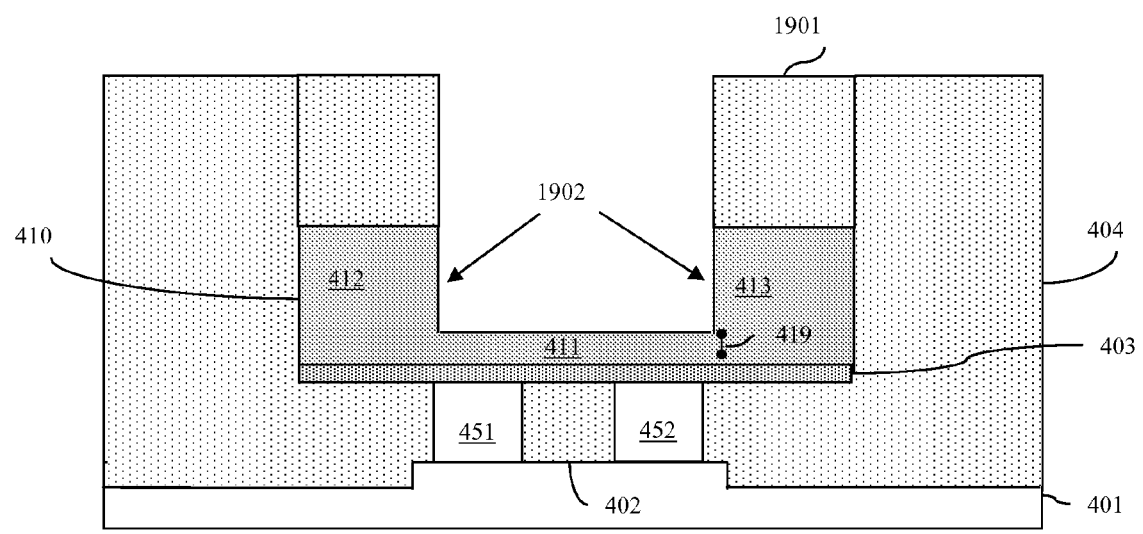
FIG. 19 is a cross-section diagram illustrating a partially completed FDTB FET 400.
Figure 20:
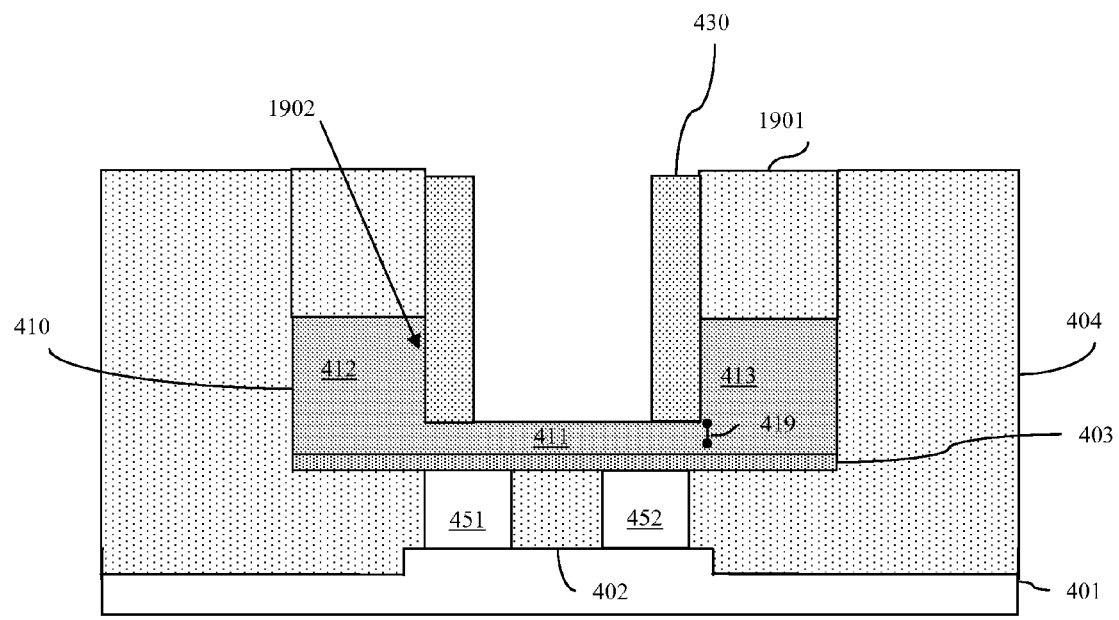
FIG. 20 is a cross-section diagram illustrating a partially completed FDTB FET 400.

Next, the center region 411 of the semiconductor layer 410 is recessed such that the semiconductor layer 410 is thicker in the first and second end regions 412-413 than in the center region 411 (526). To accomplish this, sacrificial sidewall spacers 1901 (e.g., approximately 25 nm thick oxide sidewall spacers) can be formed (e.g., using conventional sidewall spacer formation techniques) on the semiconductor layer 410 adjacent to the exposed inner sidewalls of the second insulator layer 404. Then, a directional etch process is performed to recess the exposed surfaces of the semiconductor layer 410 in the center region 411 to a predetermined thickness 419 (e.g., a predetermined thickness that is less than approximately 10 nm) (see FIG. 19). Thus, the directional etch process defines the thicker first and second end regions 412-413 and creates the inner sidewalls 1902. Once the center region 411 is recessed, dielectric sidewall spacers 430 (e.g., approximately 15 nm thick nitride sidewall spacers) can be formed (e.g., using conventional sidewall spacer formation techniques) on the inner sidewalls 1902 of the first and second end regions 421-413 (528, see FIG. 20).

Figure 21:
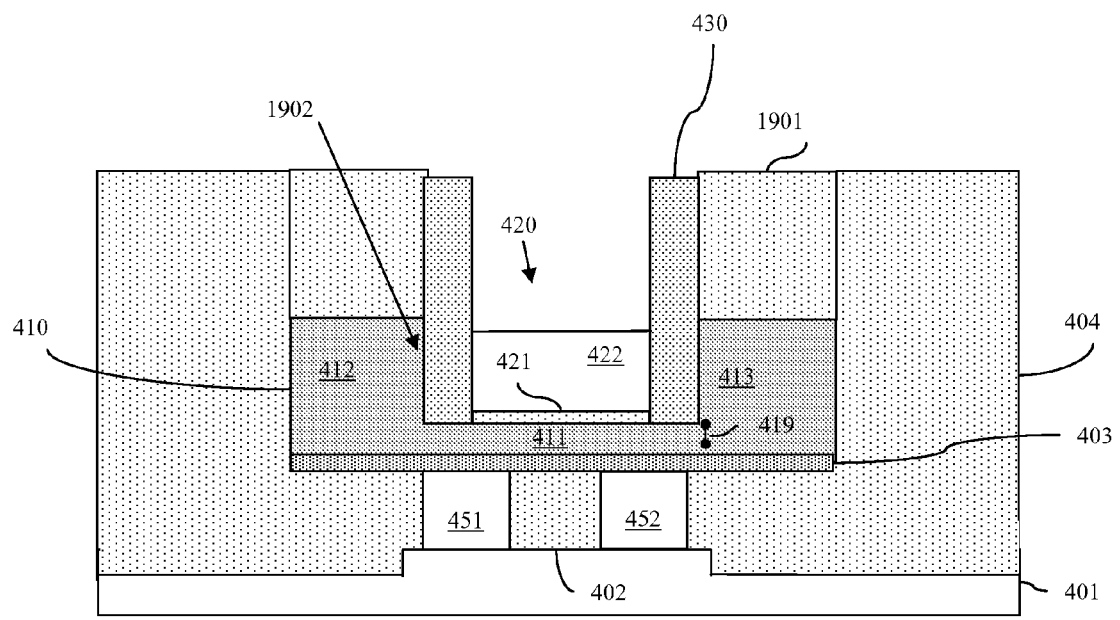
FIG. 21 is a cross-section diagram illustrating a partially completed FDTB FET 400.

Next, a front gate 420 (i.e., a top gate or second gate) can be formed on the center region 411 (530, see FIG. 21). Specifically, this process of forming the front gate 420 can comprise forming the front gate 420 on the center region 411 such that the front gate 420 is positioned laterally between the first and second end regions 412-413 and is electrically isolated from the first and second end regions 412-413 by the dielectric spacers 430. To form the front gate 420, a gate dielectric layer 421 is formed adjacent to the exposed center region 411. This gate dielectric layer 421 can be formed (e.g., using conventional processing techniques) such that it comprises an oxide material, an oxynitride material, a high-K dielectric material or some other suitable gate dielectric material. This gate dielectric layer 421 can further be formed such that it has a thickness that ranges between approximately 0.5 and 2 nm. Then, a gate conductor layer 422 is formed on the gate dielectric layer 422. This gate conductor layer 422 can be formed (e.g., using conventional processing techniques) such that it comprises a semiconductor material (e.g., polysilicon, polysilicon germanium, etc.); a metal or metal alloy material (e.g., tungsten, tantalum, aluminum, etc.); or other suitable gate conductor material. The gate conductor layer 422 can further be formed such that it is less than approximately 50 nm thick. It should be understood that the width of the gate 420 is predetermined in order to achieve a desired channel length (i.e., the width of the gate 420 defines the channel length) and this width is dependent upon the thicknesses of the spacers 1901 and 430.

Once the front gate 420 is formed, the exposed oxide materials can be recessed in order to completely remove the sacrificial spacers 1901 and to expose the top surface and all or part of the outer sidewalls (i.e., ends 414 and 415) of the end regions 412-413. Next, an implant process can be performed in order to form a source region in the first end region 412, a drain region in the second end region 413 and a channel region in the center region 411 (532). For example, a p-type dopant (e.g., boron) can be implanted into the end regions 412-413 to form source/drain regions of a p-FET or n-type dopants (e.g., phosphorus, arsenic or antimony) can be implanted into the end regions 412-413 to form source/drain regions of an n-FET. This implant process can also be used to appropriately dope the gate conductor layer 422, as necessary.

Following implantation of the source/drain dopants, additional FET processing may be performed in order to complete the FET structure 400 (534, see FIG. 4). This additional FET processing can include, but is not limited to, silicide 440 formation, deposition and planarization of an additional insulator, contact formation, etc.

In operation, the discrete portions 451-452 of the split back-gate 450 can be electrically connected to a supply voltage (e.g., Vdd or Vss) and can be biased in order to selectively adjust the potential barrier between the source/drain regions 412-413 and the channel region 411 for minimizing off-state leakage current between the drain region 413 and the source region 412 and/or for varying threshold voltage.

Therefore, disclosed above are embodiments of a field effect transistor (FET) and, more particularly, a fully-depleted, thin-body (FDTB) FET that allows for scaling with minimal short channel effects, such as drain induced barrier lowering (DIBL) and saturation threshold voltage (Vtsat) roll-off, at shorter channel lengths. The FET embodiments comprise fully-depleted, thin body (FDTB) FETs with either an edge back-gate or split back-gate that can be biased in order to selectively adjust the potential barrier between the source/drain regions and the channel region for minimizing off-state leakage current between the drain region and the source region and/or for varying threshold voltage. These unique back-gate structures avoid the need for halo doping to ensure linear threshold voltage (Vtlin) roll-up at smaller channel lengths and, thus, avoid across-chip threshold voltage variations due to random doping fluctuations. Also disclosed are method embodiments for forming such FETs.

As a result of this invention, the random-dopant-induced fluctuation of Vt can be reduced or eliminated while obtaining the benefits of minimal gate-length-induced variation of Vt. The resultant reduced Vt variation on die improves circuit speed, and reduces circuit leakage and power. Manufacturing yields and costs can furthermore result from reduced variability and increased tolerance to gate-length excursions from the target gate length.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the embodiments can be practiced with modification within the spirit and scope of the appended claims.

What is claimed is:

1. A field effect transistor comprising:
    a semiconductor layer comprising a source region, a drain region and a channel region between said source region and said drain region;
    a first gate below said semiconductor layer at a first interface between said channel region and said source region, said first gate comprising a gate conductor layer, said gate conductor layer comprising:
        a first sidewall below said source region such that an end of said source region opposite said first interface extends laterally above said first sidewall; and
        a second sidewall opposite said first sidewall and below said channel region such that said gate conductor layer does not extend laterally below a second interface between said channel region and said drain region; and
    a second gate above said channel region.

2. The field effect transistor according to claim 1,
    said semiconductor layer being thicker in said source region and said drain region than said channel region such that said second gate above said channel region is positioned laterally between said source region and said drain region, and
    said field effect transistor further comprising dielectric spacers on said semiconductor layer between said second gate and said source region and between said second gate and said drain region.

3. The field effect transistor according to claim 1, further comprising:
    a first insulator layer adjacent to said second sidewall of said gate conductor layer of said first gate, said first insulator layer extending laterally below a center of said channel region, below said second interface between said channel region and said drain region and below said drain region; and
    a second insulator layer adjacent to said first sidewall of said gate conductor layer of said first gate, said second insulator layer extending laterally below said end of said source region.

4. The field effect transistor according to claim 1, a width of said gate conductor layer of said first gate between said first sidewall and said second sidewall being at least equal to a thickness of said semiconductor layer in said channel region.

5. The field effect transistor according to claim 1, said first gate being electrically connected to a supply voltage and being biased to selectively adjust a potential barrier between said source region and said channel region for minimizing off-state leakage current between said drain region and said source region.

6. The field effect transistor according to claim 1, said first gate being electrically connected to a supply voltage and being biased to selectively adjust a potential barrier between said source region and said channel region for varying threshold voltage.

7. A field effect transistor comprising:
    a semiconductor layer comprising a source region, a drain region and a channel region between said source region and said drain region;
    a first gate below said semiconductor layer only at a first interface between said channel region and said source region such that said field effect transistor is asymmetric, said first gate comprising a gate conductor layer, said gate conductor layer comprising:
        a first sidewall below said source region such that an end of said source region opposite said first interface extends laterally above said first sidewall; and a second sidewall opposite said first sidewall and below said channel region such that said gate conductor layer does not extend laterally below a second interface between said channel region and said drain region; and
    a second gate above said channel region.

8. The field effect transistor according to claim 7,
    said semiconductor layer being thicker in said source region and said drain region than said channel region such that said second gate above said channel region is positioned laterally between said source region and said drain region, and said field effect transistor further comprising dielectric spacers on said semiconductor layer between said second gate and said source region and between said second gate and said drain region.

9. The field effect transistor according to claim 7, further comprising:
a first insulator layer adjacent to said second sidewall of said gate conductor layer of said first gate, said first insulator layer extending laterally below a center of said channel region, below said second interface between said channel region and said drain region and below said drain region; and
a second insulator layer adjacent to said first sidewall of said gate conductor layer of said first gate, said second insulator layer extending laterally below said end of said source region.

10. The field effect transistor according to claim 7, a width of said gate conductor layer of said first gate between said first sidewall and said second sidewall being at least equal to a thickness of said semiconductor layer in said channel region.

11. The field effect transistor according to claim 7, said first gate being electrically connected to a supply voltage and being biased to selectively adjust a potential barrier between said source region and said channel region for minimizing off-state leakage current between said drain region and said source region.

12. The field effect transistor according to claim 7, said first gate being electrically connected to a supply voltage and being biased to selectively adjust a potential barrier between said source region and said channel region for varying threshold voltage.

13. A field effect transistor comprising:
a semiconductor layer having an essentially planar bottom surface and a top surface opposite said bottom surface, said semiconductor layer comprising a source region, a drain region and a channel region between said source region and said drain region, said channel region having a center mid-distance between a first interface between said source region and said channel region and a second interface between said drain region and said channel region;
a first gate below said semiconductor layer at said first interface, said first gate comprising a gate conductor layer, said gate conductor layer comprising:
a first sidewall below said source region such that an end of said source region opposite said first interface extends laterally above said first sidewall; and
a second sidewall opposite said first sidewall and below a portion of said channel region between said first interface and said center; and
a second gate above said center of said channel region.

14. The field effect transistor according to claim 13, said semiconductor layer being thicker in said source region and said drain region than said channel region such that said second gate above said channel region is positioned laterally between said source region and said drain region, and
said field effect transistor further comprising dielectric spacers on said semiconductor layer between said second gate and said source region and between said second gate and said drain region.

15. The field effect transistor according to claim 13, further comprising:
a first insulator layer adjacent to said second sidewall of said gate conductor layer of said first gate, said first insulator layer extending laterally below a center of said channel region, below said second interface between said channel region and said drain region and below said drain region; and
a second insulator layer adjacent to said first sidewall of said gate conductor layer of said first gate, said second insulator layer extending laterally below said end of said source region.

16. The field effect transistor according to claim 13, a width of said gate conductor layer of said first gate between said first sidewall and said second sidewall being at least equal to a thickness of said semiconductor layer in said channel region.

17. The field effect transistor according to claim 13, said first gate being electrically connected to a supply voltage and being biased to selectively adjust a potential barrier between said source region and said channel region for minimizing off-state leakage current between said drain region and said source region.

18. The field effect transistor according to claim 13, said first gate being electrically connected to a supply voltage and being biased to selectively adjust a potential barrier between said source region and said channel region for varying threshold voltage.

* * * * *